United States Patent [19]
Wright et al.

[11] Patent Number: 5,349,544
[45] Date of Patent: Sep. 20, 1994

[54] PROGRAMMABLE SYSTEM SYNCHRONIZER

[75] Inventors: Michael J. Wright, Santa Clara; Om P. Agrawal, San Jose, both of Calif.

[73] Assignee: Advanced Micro Devices, Inc., Sunnyvale, Calif.

[21] Appl. No.: 207,317

[22] Filed: Jun. 15, 1988

[51] Int. Cl.$^5$ .............................................. G06J 1/00
[52] U.S. Cl. .................................... 364/600; 307/465; 307/465.1; 307/480; 331/1 A
[58] Field of Search ............... 364/712, 716, 931.3, 364/933.82, 934.2, 934.5, 934.8, 602, 600; 331/1 A; 307/465, 480, 465.1

[56] References Cited

U.S. PATENT DOCUMENTS

| | | | |
|---|---|---|---|
| 3,130,376 | 4/1964 | Ross | 331/1 A |
| 3,538,442 | 11/1970 | Arkell et al. | 377/47 X |
| 4,124,899 | 11/1978 | Birkrier et al. | 364/716 |
| 4,290,028 | 9/1981 | LeGrand | 331/1 A |
| 4,437,072 | 3/1984 | Asami | 331/1 A |
| 4,494,021 | 1/1985 | Bell et al. | 307/591 |
| 4,633,488 | 12/1986 | Shaw | 375/110 X |
| 4,689,581 | 8/1987 | Talbot | 331/1 A |
| 4,710,922 | 12/1987 | Scott | 370/112 X |
| 4,719,593 | 1/1988 | Threewitt et al. | 364/900 |

FOREIGN PATENT DOCUMENTS

| | | |
|---|---|---|
| 152735 | 12/1984 | Japan . |
| 137646 | 5/1989 | Japan . |
| 2065396 | 6/1981 | United Kingdom . |

OTHER PUBLICATIONS

Zaks, R. et al., *From Chips to Systems*, copyright 1987, 2nd ed. Sybex, Inc., pp. 218–223.
Buchsbaum, W., *Encyclopedia of Integrated Circuits*, Prentice-Hall, pub. 1987, pp. 54–61.
Advanced Micro Devices, "Am2971 Advanced Information data sheet" Aug. 1985.

*Primary Examiner*—Stephen M. Baker
*Attorney, Agent, or Firm*—Fliesler, Dubb, Meyer & Lovejoy

[57] ABSTRACT

A PLL is integrated on the same chip as a programmable logic circuit and interconnected therewith in any of several useful ways. In one aspect of the invention, the output frequency of the PLL may be connected to the clock input of registers in the programmable logic circuit. If the PLL performs frequency multiplication, the chip then becomes a high-speed state machine synchronized to a lower-frequency input clock. In another aspect of the invention, the signal present at different parts of the phase lock loop may be provided to inputs of the programmable logic circuit. In another aspect, outputs of the programmable logic circuit may be used to control the operation and/or characteristics of various components in the PLL. For example, if a counter is included in the phase lock loop for causing the loop to generate a frequency multiple of the input signal, the counter may be made programmable according to outputs of the state machine. Similarly, the characteristics of the phase detector or loop filter may be dynamically adjusted according to outputs of the state machine. In yet another aspect of the invention, an output of the programmable logic circuit is, or is used to generate, one of the inputs to the phase detector in the PLL.

25 Claims, 3 Drawing Sheets

PROGRAMMABLE SYSTEM SYNCHRONIZER

BACKGROUND OF THE INVENTION

1. Field of the Invention

The invention relates generally to programmable logic devices, and more particularly to a programmable logic device having an on-chip analog functional block, such as a phase lock loop.

2. Description of Related Art

Programmable logic devices such as the programmable array logic (PAL) device offer digital designers a flexible and cost-effective implementation for complex logic circuits. PAL is a trademark of Monolithic Memories, Inc. A typical PAL includes a fuse-programmable or electrically erasable programmable array of AND gates, and a fixed array of OR gates. In some programmable logic circuits, the OR array is itself programmable. The outputs of the combinatorial logic arrays of programmable logic circuits may be coupled directly to an I/O pin, or input to clockable registers. In many devices, registered outputs are fed back to the inputs of the combinatorial array. Some programmable logic circuits also include a clockable input synchronizing register located between an input pin and one of the inputs to the combinatorial array.

Programmable logic circuits having clockable registers are ideal for use as state machines or, as they are sometimes called, sequencers. A state machine includes a number of registers, which store the current state of the machine, and a combinatorial logic array, for providing the next state to be stored in the registers. Inputs to the combinatorial array are provided both from external pins and from previous outputs of the state registers fed back to inputs. In all programmable logic devices currently available, the clock signal which is used to clock the various registers is supplied from outside the chip, either directly or via the logic array.

The programmable logic device has given the digital designer a means of reducing circuit size through higher integration, ease of design and documentation by software specification, and security of keeping the design proprietary. There is currently no equivalent to the programmable logic circuit in the analog realm. The semi-custom "analog array" is bringing large scale integration to the analog designer, but the approach is still very expensive. Part of the reason for the lag between the analog and digital worlds is that designers typically try to accomplish analog functions by performing an analog-to-digital conversion as soon as possible, implementing the solution in the digital realm and then performing a digital-to-analog conversion as the final step.

All the programmable logic devices currently on the market are entirely digital in nature, with no analog components included. Even at the board level it has been unusual for system designers to incorporate digital programmability in an analog functional block since the design engineer must be confident designing with both analog and digital parts. There are currently no devices on the market, as far as Applicants are aware, where a circuit has both analog and digital components working together to accomplish a programmable function. Fixed function devices exist (such as the Am8151 color palette) which incorporate both analog and digital components, but until now all of these devices have lacked the flexibility of programmability.

SUMMARY OF THE INVENTION

According to the invention, an analog functional block is provided together with a programmable logic circuit on the same chip and connected together in any of several advantageous manners. For example, the analog functional block may be a phase lock loop (PLL), a digital-to-analog converter (DAC) or a comparator. Advantageously, it is a PLL. A related product which is known is the Am2971 Programmable Event Generator (PEG), as described in an August 1985 Data Sheet published by Advanced Micro Devices, Inc. A similar product is described in U.S. Pat. No. 4,719,593. The PEG chip comprises, among other things, a 32-word PROM of 18 bits per word, the outputs of which are latched by a register. Five bits of each word form a Next Address, one bit forms a Stop bit, and the remaining 12 bits are provided to output pins. The sequence by which these 12 bits change states may be used as a set of 12 separate timing sequences. The timing resolution of the output signals depends on the internal clock used to clock the register, which derives from a clock control circuit. The clock control circuit includes a phase lock loop which is fuse-programmable to multiply an input frequency by either 5 or 10. The output of the phase lock loop may be divided by 1, 2 or 4 depending on other burnable fuses.

The PEG chip is intended primarily for use as a digital substitute for analog delay lines or as a general purpose user programmable timing/waveform generator. The part performs excellently in those areas of application, but since the output waveforms are generated by a programmed PROM, the part has limited flexibility outside those areas. Additionally, the PEG chip includes only three input lines, which function to designate a start address for timing sequences in the PROM. The part therefore has only limited responsiveness to external system conditions. Finally, the selection of an internal clock frequency is programmable only once, thereby substantially preventing use of the part in certain application areas.

According to the invention, a PLL is integrated on the same chip as a programmable logic circuit and interconnected therewith in any of several useful ways. In one aspect of the invention, the output frequency of the PLL may be connected to the clock input of registers in the programmable logic circuit. If the PLL performs frequency multiplication, the chip then becomes a high-speed state machine synchronized to a lower-frequency input clock. In another aspect of the invention, the signal present at different parts of the phase lock loop may be provided to inputs of the programmable logic circuit. In another aspect, outputs of the programmable logic circuit may be used to control the operation and/or characteristics of various components in the PLL. For example, if a counter is included in the phase lock loop for causing the loop to generate a frequency multiple of the input signal, the counter may be made programmable according to outputs of the state machine. Similarly, the characteristics of the phase detector or loop filter may be dynamically adjusted according to outputs of the state machine. In yet another aspect of the invention, an output of the programmable logic circuit is, or is used to generate, one of the inputs to the phase detector in the PLL.

BRIEF DESCRIPTION OF THE DRAWINGS

The invention will be described with respect to particular embodiments thereof. Other objects, features and advantages of the invention will become apparent upon reference to the specification and the drawings, in which.

DETAILED DESCRIPTION

Figure 1:
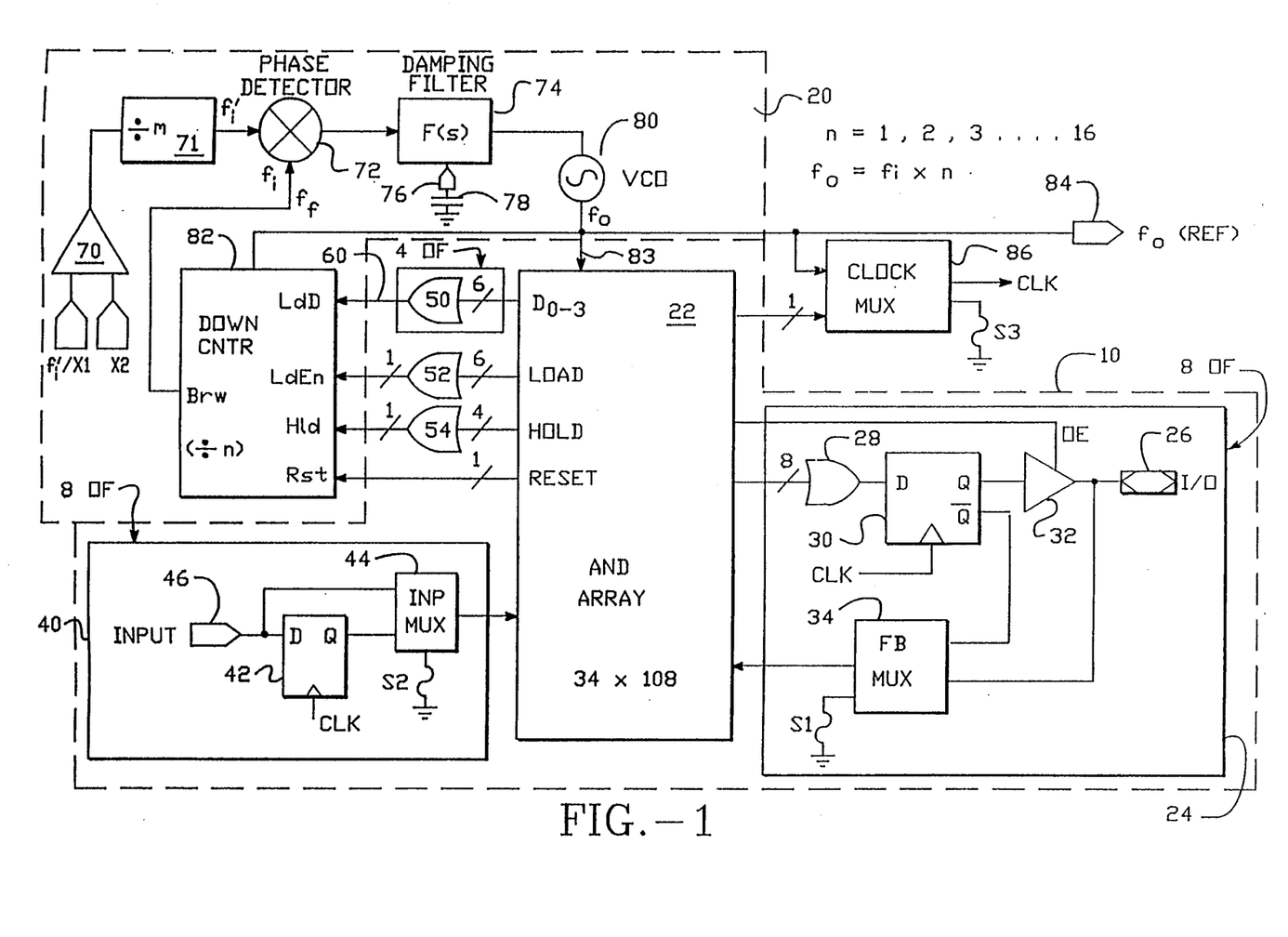
FIGS. 1, 2 and 3 are block diagram schematics of integrated circuit chips embodying the present invention.

FIG. 1 shows a block diagram of an integrated circuit chip which incorporates the present invention. It includes a programmable logic circuit 10 coupled with, as the analog functional block, a phase lock loop 20. The programmable logic circuit 10 includes a programmable AND array 22 having 34 inputs (17 signals plus their complements) and capable of producing 108 product term outputs. Eight output blocks 24 are provided, each connecting to a different I/O pin 26 on the package. Eight of the product terms from the AND array 22 feed each of the output circuit blocks 24, forming 8 inputs to an OR gate 28 in such output circuit block 24. Also inside each output circuit block 24 is a D flip-flop 30, an output buffer 32 and a feedback multiplexer 34. The output of OR gate 28 is connected to the D input of flip-flop 30, and the Q output of flip-flop 30 is connected to the input of output buffer 32. The output enable on the output buffer 32 in each of the output circuit blocks 24 is connected to a product term from the AND array 22. The output of the output buffer 32 is connected to the I/O pin 26 and also to one input of the feedback multiplexer 34. The other input of the feedback multiplexer 34 is connected to the $\overline{Q}$ output of the flip-flop 30. A burnable fuse S1 controls the selection made by feedback multiplexer 34, and the output of feedback multiplexer 34 forms one of the inputs to AND array 22. The flip-flop 30 in each of the output circuit blocks 24 also includes a clock input, the connection to which is described below.

Programmable logic circuit 10 also includes eight input circuit blocks 40. Each of the input circuit blocks 40 includes an input synchronizing latch 42 and an input multiplexer 44. The D input of the input synchronizing latch 42 in each of the input circuit blocks 40 is connected to an input pin 46 on the package, and also to one input of the input multiplexer 44. The Q output of the input synchronizing latch 42 is connected to the other input of input multiplexer 44. The selection performed by input multiplexer 44 is controlled by a fuse S2 present in each of the input circuit blocks 40, and the output of input multiplexer 44 in each of the input circuit blocks 40 is connected to an input of the AND array 22. The input synchronizing latch 42 also has a clock input, the connection to which is described below.

For controlling a counter in the PLL, described below, 24 of the product terms from AND array 22 are connected as four groups of six product terms each to a respective one of four OR gates 50. The outputs from these four OR gates 50 form a 4-bit data output 60 of the programmable logic circuit 10. Six additional product terms from the AND array 22 are connected to the inputs of a 6-input OR gate 52, the output of which forms a Load Enable output of the programmable logic circuit 10. Four additional product terms from the AND array 22 are ORed together by an OR gate 54, the output of which forms a HOLD output of the programmable logic circuit 10. Finally, still another product term from AND array 22 forms a RESET output from the programmable logic circuit 10.

The phase lock loop 20 comprises an input signal buffer 70 having an output coupled to one input of a phase detector 72. An optional frequency divider 71 may be inserted between the buffer 70 and the phase detector 72. For clarity, the signal which appears on this first input of the phase detector 72 will be referred to as an input signal, $f_i$. The other input to phase detector 72 receives a feedback signal $f_f$, described below. The output of the phase detector 72 is connected to the input of a damping filter 74. Another input of the damping filter 74 is connected through a package pin 76 and through an external capacitor 78 to ground. In conjunction with the external capacitor 78, the damping filter 74 performs a function F(s) on the signal input to the damping filter 74. The output of damping filter 74 is connected to the control input of a VCO 80, the output of which constitutes an output signal $f_o$. The signal $f_o$ is coupled to the clock input of a 4-bit down counter 82, having a borrow output which pulses once each time the counter 82 counts past zero. The signal $f_o$ is also connected to one of the inputs of AND array 22, as well as to an output package pin 84. To complete the phase lock loop, the borrow output of the down counter 82 constitutes the feedback signal $f_f$ which is connected to the second input of the phase detector 72. The input signal buffer 70 has two inputs, X1 and X2. A user may either place a crystal across X1 and X2 in a conventional manner, or provide an already oscillating clock signal on the X1 input. In either case, the signal on the output of input signal buffer 70 is referred to herein as $f_i$. In the apparatus shown in FIG. 1, $f_i'$ and $f_i$ are one in the same.

The down counter 82 is a 4-bit divide-by-n counter having a load data input, a load enable input, a hold input and a reset input. The four data outputs of the programmable logic circuit 10 (outputs from the OR gates 50) are connected to the load data inputs of the down counter 82. The Load Enable output of the programmable logic circuit 10 is connected to the load enable input of the down counter 82. Similarly, the hold output of the programmable logic circuit 10 is connected to the HOLD input of the down counter 82, and the RESET output of programmable logic circuit 10 is connected to the reset input of down counter 82.

The apparatus of FIG. 1 also includes a clock multiplexer 86 having one input coupled to receive the $f_o$ signal and the other input coupled to receive one of the product terms from AND array 22. The selection performed by clock multiplexer 86 is determined by a fuse S3, and the output drives the clock inputs to all the input synchronizing latches 42 and the flip-flops 30.

The apparatus of FIG. 1 is extremely versatile and illustrates several aspects of the present invention. In one aspect, the frequency output of the VCO 80, $f_o$, may be used to clock the registers in the programmable logic circuit 10. In order to do this, the fuse S3 is either burned or left unburned, as appropriate, such that the clock mux 86 carries the $f_o$ signal to the clock inputs of each of the registers 30 and 42. If n is greater than 1 in down-counter 82, $f_o$ has a frequency which is an integer multiple of the input frequency $f_i'$. The circuit then becomes a high-speed programmable state machine synchronized to a low-speed clock input. The eight registers 30 store the current state of the state machine, and the inputs 46 and selected ones of the I/O pins 26, together with the $\bar{Q}$ outputs of selected ones of the registers 30, form inputs to the programmed combinatorial array which provides the next state to the registers 30. Selected ones of the I/O pins 26 therefore carry high-speed timing signals for controlling external apparatus (not shown) with a resolution of $nf_i'$.

In another aspect, whether or not the registers 30 and 42 in the programmable logic circuit 10 are clocked from the PLL 20, the operation and characteristics of the PLL 20 may be controlled by outputs of the programmable logic circuit 10. For example, the data outputs 60 and the Load Enable output of the programmable logic circuit 10 may be used to change the value of n in the down-counter 82 and thereby change the frequency multiplication performed by PLL 20. This is a dynamic change not permitted by the PEG chip. The HOLD and RESET outputs of the programmable logic circuit 10 can also be used to dynamically change the operation of down-counter 82. Additionally, another counter (not shown) may be inserted between the output $f_i'$ of the input signal buffer 70 and the input $f_i$ of the phase detector 72 for dividing the input frequency by m, the value of m being also dynamically adjustable by outputs (not shown) of the programmable logic circuit 10. Of course, the value of m or n should not be changed more frequently than the lock acquisition time of the PLL 20, which depends on, among other things, the frequency of $f_i$, the extent of the change in m and n, and the design of the phase detector 72.

As previously mentioned, the output signal $f_o$ is available on output pin 84. The apparatus programmed to accomplish this function therefore provides an output signal having a frequency which is dynamically adjustable, in response to input signals or in response to sequential states, to any frequency $(n/m)f_i'$.

The programmable logic circuit 10 may have outputs to control characteristics of various other components in the PLL 20. For example, the phase detector 72 may be designed to have digital inputs for selecting different positions on a design trade-off curve, such as lock acquisition time v. noise and jitter. Similarly, the damping filter 74 may be designed so as to include digital inputs for selecting time constants. In either case, outputs (not shown) of the programmable logic circuit 10 may be provided for controlling these digital inputs.

In another aspect of the invention, the fuse S3 controlling the clock mux 86 may be either burned or left unburned, as appropriate, such that the clock inputs of the registers 30 and 42 are controlled from a product term in the AND array 22. A system clock may be provided at one of the inputs 46, and fed directly through the corresponding input multiplexer 44 into the AND array 22 as an input line. The system clock may then be gated as desired in the AND array 22 and provided to the clock mux 86 for clocking the registers. Alternatively or additionally, and more closely associated with the analog/digital features of the present invention, the clock signal which ultimately appears at the output of clock mux 86 may be programmed to derive from the frequency output $f_o$ of the VCO 80 in PLL 20. As previously mentioned, the signal $f_o$ is connected to the AND array 22 as an input. It should be noted that other variations on this theme are possible as well, such as by providing an OR gate (not shown) between product term outputs of AND array 22 and the second input of clock multiplexer 86, so that the programmable logic circuit 10 may select its own clock either from $f_o$ or from any of the inputs 46 or 26.

Yet another aspect of the invention illustrated by the architecture of FIG. 1 results from the connection of the VCO 80 output signal $f_o$ as an input to programmable logic circuit 10. Assuming the programmable logic circuit 10 is clocked by some other source provided on one of the input pins 46 or 26, then the signal $f_o$ may be gated as appropriate and according to the sequences programmed into the state machine and provided to one or more of the outputs 26 as timing signals. As mentioned, $f_o$ itself may have its frequency controlled by the state machine. Since any such output signal must first pass through one of the output registers 30, these signals would be synched to whatever the source of the clock signal used to clock the state machine. Such synchronization may be avoided, of course, by providing in one or more of the output circuit blocks 24 a path (not shown) from the output of the corresponding OR gate 28 to the input of output buffer 32, which path may be selected by a fuse-programmable multiplexer (not shown).

Figure 2:
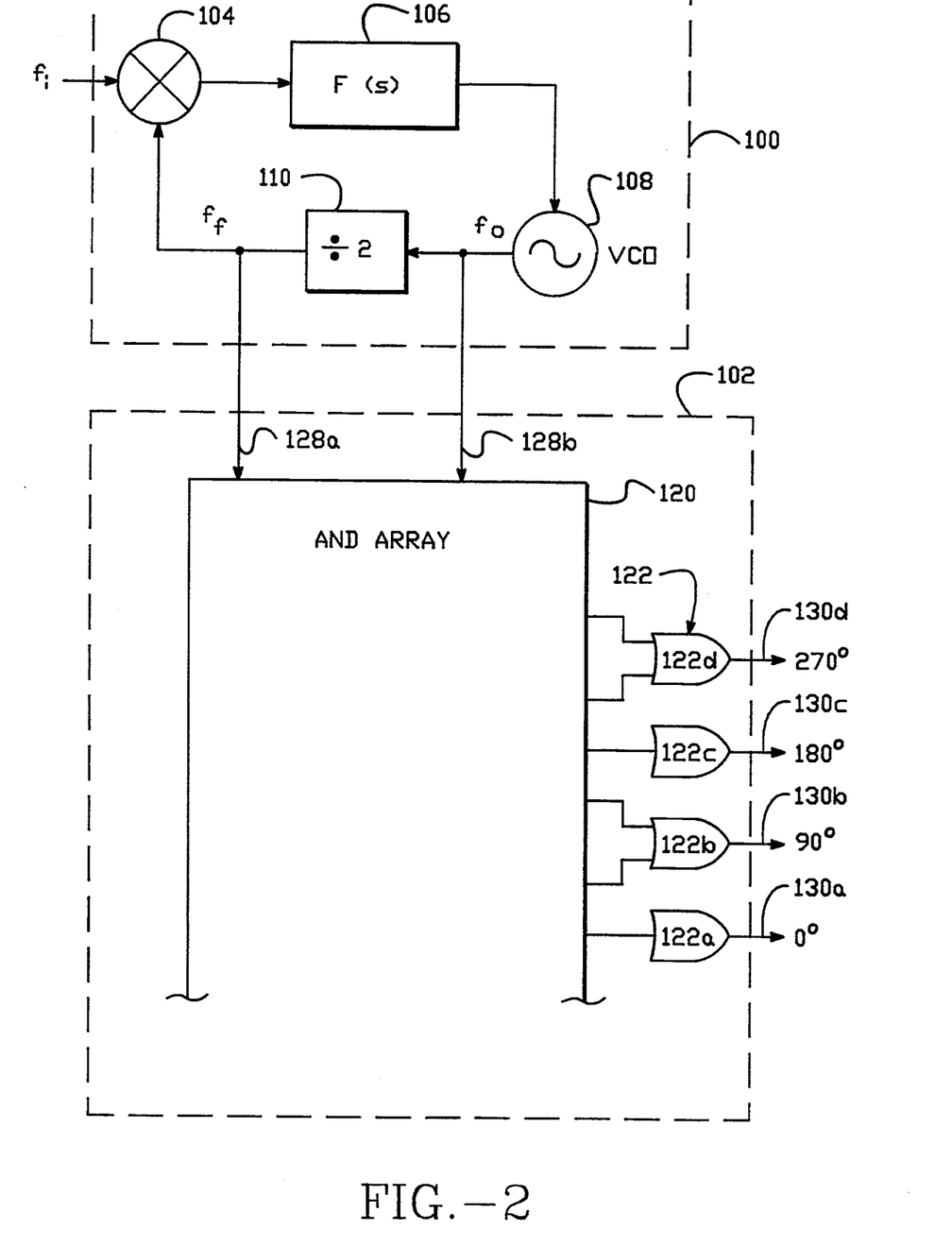

The apparatus of FIG. 1 may be modified to demonstrate yet another application of the invention, by providing a connection (not shown) from some other point in the phase lock loop as another input to the AND array 22. For example, the $f_f$ signal may be provided to the AND array 22. This permits certain interaction between the $f_o$ and the $f_f$ signals in the programmable logic circuit 10. These capabilities are illustrated more clearly in FIG. 2. FIG. 2 shows a PLL 100 integrated on the same chip as a programmable logic circuit 102, which is programmed to act as a phase shifter. Only relevant portions of the PLL 100 and the programmable logic circuit 102 are shown. The PLL 100 includes a phase detector 104, the output of which feeds a damping filter 106. The output of damping filter 106 forms an input to a VCO 108, the output $f_o$ of which forms an input to a divide-by-2 counter 110. The output of counter 110, $f_f$, forms a feedback signal input to the phase detector 104 and the other input to phase detector 104, $f_i$, is supplied by another source (not shown).

Programmable logic circuit 102 comprises a combinatorial array having an AND array 120 and a plurality of OR gates 122. The VCO output signal $f_o$ is provided to one input 128b of the AND array 120, and the output $f_f$ of counter 110 is provided to another input 128a of the AND array 120. Product term outputs of AND array 120 are provided to four of the OR gates, designated 122a, 122b, 122c and 122d, which provide output signals on respective output lines 130a, 130b, 130c and 130d. The AND array 120 is programmed, and the product term outputs are connected to OR gates 122a, 122b, 122c and 122d, so as to implement the following boolean functions:

$130a = f_f$ $130b = f_o \cdot f_f + f_o \cdot f_f$ $130c = f_f$ $130d = f_o \cdot f_f + f_o \cdot f_f$ Many inputs, product term outputs and OR gates 122 may be provided in the combinatorial logic circuit 102 other than those shown in FIG. 2.

As so programmed, it can be seen that the apparatus of FIG. 2 operates as phase shifter for an input signal $f_i$. The output 130a of programmable logic circuit 102 receives a signal which is a non-inverted version of the feedback signal $f_f$ in the PLL 100. This signal is guaranteed by the PLL 100 to have the same frequency as the input signal $f_i$. The output 130c of the programmable logic circuit 102 receives an inverted version of $f_f$, and therefore carries a signal which is 180° following the signal on output 130a. Output 130b of the programmable logic circuit 102 carries the XNOR of $f_o$ and $f_f$, and since $f_o$ oscillates at twice the frequency of $f_f$, that signal has the same frequency as $f_f$ (and the signal on output 130a) but lags the signal on output 130d by 90°. Similarly, output 130d of the programmable logic circuit 122 carries a signal which is the XOR of of $f_o$ and $f_f$, which oscillates at the same frequency of $f_f$ and 270° in phase lag behind the signal on output 130a.

The provision on a single chip of the PLL 100 and programmable logic circuit 102 shown in FIG. 2, connected as shown, therefore permits programming of the apparatus to output four signals which are 90° phase shifted from each other. It will be apparent that if the divider network 110 is increased, and additional inputs are provided to the programmable logic circuit 102 from inter-stage signals, then the phase interval between outputs can be reduced. In addition, other applications will be apparent for the combination of a PLL and a programmable logic circuit in which signals from various points in the phase lock loop are provided as inputs to the programmable logic circuit.

It should be noted that in each of these circuits, the PLL portion may well be conventional. The VCO may also be conventional, and may operate at frequencies between 70 and 100 MHz, for example. The phase detector chosen may be any of many well-known types, and may itself be analog or digital, as long as it is designed to handle the form of signals which it will receive on its two inputs. Additionally, the design tradeoffs inherent in each of the various components in the PLL will be apparent to persons familiar with PLL technology. Background material on PLL technology may be found in any of the following references: F. Gardner, "Phaselock Techniques" (New York: Wiley, 1979); A. Blanchard (New York: Wiley 1976); and S. Soclof, "Applications of Analog Integrated Circuits" (Prentice Hall, 1985).

Since analog and digital circuits are integrated on the same chip, standard techniques should be used to minimize cross-coupling of signals. Such techniques include keeping the analog and digital portions physically separate on the chip to the extent possible; avoiding parallel lines carrying analog and digital signals; and maintaining separate analog and digital power and grounds.

Figure 3:
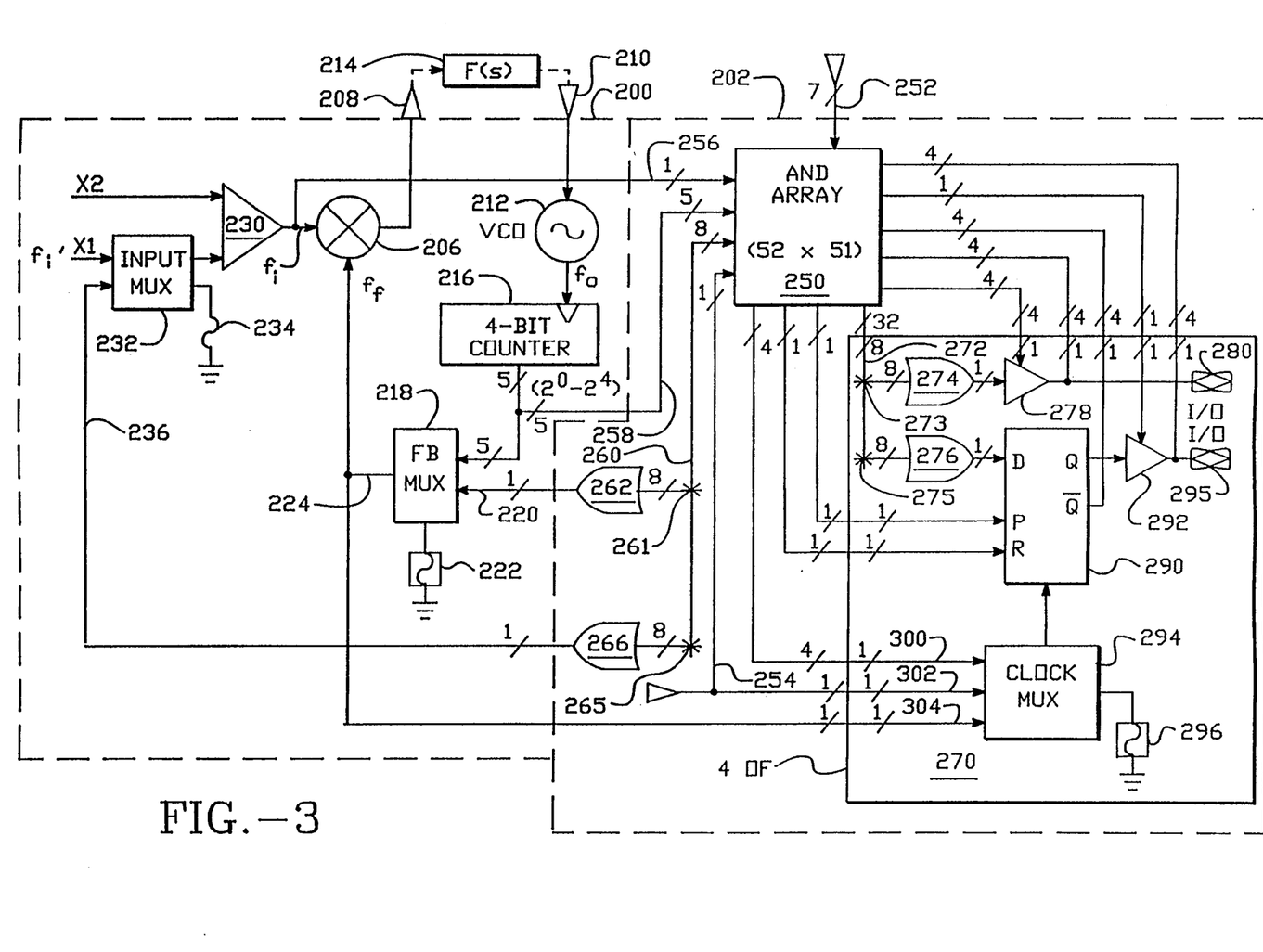

FIG. 3 shows yet another embodiment of the invention. Like the embodiment of FIG. 1, the embodiment of FIG. 3 comprises a PLL portion 200 and a programmable logic circuit portion 202. The PLL portion 200 comprises a phase detector 206 having an $f_i$ input and an $f_f$ input and having an output connected to an external pin 208. Another external pin 210 is connected to the voltage control input of a VCO 212. A designer may connect between the pins 208 and 210 a damping circuit of any desired complexity, designated in FIG. 3 as 214. The output of VCO 212 is an $f_o$ signal which is connected to the clock input of a 4-bit counter 216, the five outputs of which ($2^0$–$2^4$) are connected to five inputs of a feedback multiplexer 218. The feedback multiplexer 218 has a sixth input 220, the connection to which is described below. The feedback multiplexer 218 is programmable according to a bank 222 of fuses, and provides an output 224 which is connected back to the $f_f$ input of the phase detector 206. The $f_i$ input of the phase detector 206 is connected to the output of an input signal buffer 230. The input signal buffer 230 has one input connected to an X2 package pin, and a second input connected to the output of an input multiplexer 232. The input multiplexer 232 is programmable according to a fuse 234, and has two inputs. The first of these inputs is connected to an X1 package pin and the second input, designated 236, is connected as described below. The inputs X1 and X2 are adapted to either accept an external crystal or receive an externally supplied oscillating signal $f_i'$ on X1.

The programmable logic circuit 202 comprises an AND array 250 which is fuse-programmable to provide product term outputs on the basis of any subset of a plurality of inputs. (The term "subset" is used in this application in the mathematical sense; a subset of a set may include all elements of the set.) A group 252 of seven of the array inputs is connected to external package pins. An eighth one of the array inputs, designated 254, is also connected to an external package pin and is further connected as hereinafter described. Another one of the array inputs, designated 256, is connected to the $f_i$ input of the phase detector 206, and a group 258 of five more of the array inputs are connected to the five respective outputs of the 4-bit counter 216.

A group 260 of eight of the product term outputs of AND array 250 is connected via an 8×8 fuse array 261 to the eight inputs of an OR gate 262, the output of which is connected to the input 220 of the feedback multiplexer 218 in the PLL portion 200. The same group 260 of eight product term outputs is also connected via another 8×8 fuse array 265 to the eight inputs of another OR gate 266, the output of which is connected to the input 236 of the input multiplexer 232. The use of the same group of output product terms from the AND array 250 to feed more than one OR gate via small fuse arrays is known as product term sharing.

The programmable logic circuit 202 further includes four output logic macrocells 270. Each of the macrocells 270 receives a group 272 of eight of the product term outputs from the AND array 250 and feeds them, in a product term shared manner, to two OR gates 274 and 276 via respective fuse arrays 273 and 275. The output of OR gate 274 in each macrocell feeds the input of an output buffer 278 in that macrocell, the output enable input of which buffer is connected to another one of the product term outputs for each macrocell. The output of each output buffer 278 is connected both to an I/O pin 280 for each macrocell and also to a corresponding one of the array inputs of AND array 250.

The output of OR gate 276 in each macrocell 270 is connected to the D input of a register 290 in the macrocell, the Q output of which register is connected to the input of another output buffer 292 for each register. The Q output of the register 290 in each of the macrocells 270 forms yet another input to AND array 250. The output of each output buffer 292 is connected to an I/O pin 295 and also to another corresponding one of the inputs to AND array 250. A common output enable for the output buffer 292 in all four of the macrocells 270 is connected to a single output of AND array 250. Similarly, a common preset for the register 290 in all four of the macrocells 270 is connected to a single output of AND array 250, and a common reset for the register 290 in all of the macrocells 270 is connected to a single output of AND array 250.

Each macrocell 270 further comprises a clock multiplexer 294 which is fuse-programmable according to a respective fuse bank 296. Each clock multiplexer 294 has an output connected to the clock input of the register 290 in the corresponding macrocell 270, and three inputs 300, 302 and 304. The input 300 for the clock multiplexer in each of the macrocells 270 is connected to a corresponding one of the outputs of AND array 250. The inputs 302 to all of the clock multiplexers 294 are connected in common to the input 254, previously described. Finally, the inputs 304 to all of the clock multiplexers 294 are connected in common to the output 224 of feedback multiplexer 218 in PLL portion 200.

As with the apparatus of FIG. 1, the apparatus of FIG. 3 illustrates several aspects of the invention. For example, the signal present at various nodes of the PLL 200 are available to inputs of the AND array 250. Such nodes include the $f_i$ input to the phase detector 206 as well as the outputs of each of the four stages of 4-bit counter 216. The $2^0$ output of 4-bit counter 216, which follows the $f_o$ output of VCO 212, is also available in the group 258 of inputs to the AND array 250.

Illustrating another aspect of the invention, the output of OR gate 262 in the programmable logic circuit block 202 is selectably coupled through input 220 of the feedback multiplexer 218 to the $f_f$ input of the phase detector 206. This permits enormous flexibility to the designer in providing the feedback signal to the phase detector 206. One advantageous way of programming the programmable logic circuit 202 includes generating the signal on the output of OR gate 262 so as to have one pulse every time the five outputs of the 4-bit counter 216 reach a predetermined value.

Illustrating yet another aspect of the invention, the output of the programmable logic circuit 202 which derives from OR gate 266 is selectably coupled through input multiplexer 232 to the $f_i$ input of phase detector 206. Illustrating yet another aspect of the invention, the clock multiplexer 294 can select a clock signal for clocking the state registers 290 either from the output of feedback multiplexer 218, from an external pin 254, or from an output of AND array 250. The output of AND array 250 can, of course, be programmed as any combinatorial function of the inputs to AND array 250, including the five outputs of 4-bit counter 216.

One difference between the embodiment of FIG. 1 and the embodiment of FIG. 3 is that the damping filter 74 (FIG. 1) is located substantially on-chip, while the damping filter 214 (FIG. 3) is located entirely off-chip. Locating the damping filter substantially on-chip permits a designer to use the device without necessarily having extensive familiarity with analog circuit design. On the other hand, locating the damping filter off-chip gives a designer the flexibility to implement a filter of any desired complexity and having any desired characteristics. In particular, if the damping filter is located off-chip, apparatus according to the invention may be used to perform frequency modulation, frequency demodulation, FSK demodulation, tone detection or signal recovery from a noisy source. Many other applications will be apparent.

The invention has been described with respect to particular embodiments thereof, and it will be understood that numerous variations of these embodiments are possible within the scope of the claims. For example, other types of phase lock loops may be substituted for those shown in FIGS. 1, 2 and 3 including more complex dual loops. As another example, the phase detector, filter and/or controlled oscillator may be implemented digitally. As another example, the registers in each of the state machines may be implemented with toggle flip-flops, or some other type of flip-flop, instead of or in addition to the D flip-flops as shown in the drawings. In all cases, the input of such flip-flop is nevertheless referred to herein as the data input. As another example, the programmable elements in the programmable logic circuit can comprise MOS devices instead of burnable fuses, and may be UV or electrically erasable. All these variations and others which will be apparent to a person of ordinary skill after reading the present specification are intended to be within the scope of the claims.

We claim:

1. A single chip integrated circuit programmable logic device comprising:

a phase lock loop (20, 100, 200);

a programmable logic circuit (10, 102, 202) having at least one logic circuit input (e.g., 26, 46, 128a, 256) and at least one logic circuit output (e.g., 26, 60, 130a, 236, 280);

wherein said programmable logic circuit comprises:

a programmable combinatorial logic array (22, 28, 50, 52, 54, 120, 122, 250, 262, 266, 274, 276) having at least one array input and at least one array output and being programmable such that each of said array outputs carries an array output signal which is a programmable Boolean function of a subset of said array inputs;

logic circuit input coupling means (e.g., 42, 44) for providing to one of said array inputs the signal on one of said logic circuit inputs (e.g., 46);

logic circuit output coupling means (e.g., 30, 32) for providing to one of said logic circuit outputs (e.g., 26) the signal on one of said array outputs; and a state register (30, 290) having an input coupled to one of said array outputs and an output coupled to one of said array inputs; and inter-block coupling means (e.g., 60, 83, 128a, 220, 236, 256, 258, 304) for coupling said phase lock loop to said programmable logic circuit.

2. A single chip integrated circuit programmable logic device comprising:

a phase lock loop (20, 100, 200) wherein said phase lock loop comprises:

phase detector means (72, 104, 206) having an output and first ($f_i$) and second ($f_f$) inputs, for providing a signal indicative of the phase difference between the signals on said first and second inputs;

oscillator means (80, 108, 212) for generating an oscillating signal $f_o$, said oscillator means having an output carrying said signal $f_o$ and a control input, said signal $f_o$ having a frequency responsive to the signal on said control input;

filter means (74, 76, 106, 208, 210) for coupling a filtered version of said output of said phase detector means to said control input of said oscillator means;

means (X1, X2, 70, 232) for coupling a PLL input clock signal $f_i$ to said first input of said phase detector means; and feedback means (82, 110, 216, 218) for coupling a feedback signal $f_f$ to said second input of said phase detector means;

a programmable logic circuit (10, 102, 202) having at least one logic circuit input (e.g., 26, 46, 128a, 256) and at least one logic circuit output (e.g., 26, 60, 130a, 236, 280); and inter-block coupling means (e.g., 60, 83, 128a, 220, 236, 256, 258, 304) for coupling said phase lock loop to said programmable logic circuit, wherein said inter-block coupling means comprises means (83, 128a, 128b, 256, 258) for coupling a signal from said first input of said phase detector means of said phase lock loop to one of said logic circuit inputs.

3. A single chip integrated circuit programmable logic device comprising:

a phase lock loop (20, 100, 200) wherein said phase lock loop comprises:

phase detector means (72) having an output and first ($f_i$) and second ($f_f$) inputs, for providing a signal indicative of the phase difference between the signals on said first and second inputs;

oscillator means (80) for generating an oscillating signal $f_o$, said oscillator means having an output carrying said signal $f_o$ and a control input, said signal $f_o$ having a frequency responsive to the signal on said control input;

filter means (74) for coupling a filtered version of said output of said phase detector means to said control input of said oscillator means;

means (X1, X2, 70) for coupling a PLL input clock signal $f_i$ to said first input of said phase detector means; and frequency divider means (82) for coupling to said second input of said phase detector means a signal having a frequency which is 1/n times the frequency of the signal $f_o$;

a programmable logic circuit (10, 102, 202) having at least one logic circuit input (e.g., 26, 46, 128a, 256) and at least one logic circuit output (e.g., 26, 60, 130a, 236, 280); and inter-block coupling means (e.g., 60, 83, 128a, 220, 236, 256, 258, 304) for coupling said phase lock loop to said programmable logic circuit, wherein said inter-block coupling means comprises means (e.g., 60, 220) for controlling the operation of frequency divider means of said phase lock loop in response to at least one of said logic circuit outputs, and wherein said means for controlling the operation of said frequency divider means comprises means for providing n to said frequency divider means in response to said at least one (60) of said logic circuit outputs.

4. An integrated circuit according to claim 3, wherein said programmable logic circuit further comprises a plurality of output registers, each of said output registers having an input coupled to one of said logic circuit outputs, n being represented by the value stored in said plurality of output registers, wherein said means for providing n to said frequency divider means comprises means for coupling said outputs of said plurality of output registers to said frequency divider means.

5. A single chip integrated circuit programmable logic device comprising:

a phase lock loop (20, 100, 200) wherein said phase lock loop comprises:

phase detector means (72, 104, 206) having an output and first ($f_i$) and second ($f_f$) inputs, for providing a signal indicative of the phase difference between the signals on said first and second outputs;

oscillator means (80, 108, 212) for generating an oscillating signal $f_o$, said oscillator means having an output carrying said signal $f_o$ and a control input, said signal $f_o$ having a frequency responsive to the signal on said control input;

filter means (74, 76, 106, 208, 210) for coupling a filtered version of said output of said phase detector means to said control input of said oscillator means;

means (X1, X2, 70, 232) for coupling a PLL input clock signal $f_i$ to said first input of said phase detector means; and feedback means (82, 110, 216, 218) for coupling a feedback signal $f_f$ to said second input of said phase detector means;

a programmable logic circuit (10, 102, 202) having at least one logic circuit input (e.g., 26, 46, 128a, 256) and at least one logic circuit output (e.g., 26, 60, 130a, 236, 280); and inter-block coupling means (e.g., 60, 83, 128a, 220, 236, 256, 258, 304) for coupling said phase lock loop to said programmable logic circuit, wherein said feedback means comprises means (218) for coupling a non-loop signal to said second input of said phase detector means, and wherein said inter-block coupling means comprises:

means (258) for coupling said output of said oscillator means to one of said logic circuit inputs; and means for coupling a first one of said logic circuit outputs to said means for coupling a non-loop signal to said second input of said phase detector means.

6. An integrated circuit according to claim 5, wherein said means for coupling a non-loop signal comprises means (218) for selectably coupling to said second input of said phase detector means either said first one of said logic circuit outputs or said output of said oscillator means.

7. A single chip integrated circuit programmable logic device comprising:

a phase lock loop (20, 100, 200) wherein said phase lock loop comprises:

phase detector means (72, 104, 206) having an output and first ($f_i$) and second ($f_f$) inputs, for providing a signal indicative of the phase difference between the signals on said first and second inputs;

oscillator means (80, 108, 212) for generating an oscillating signal $f_o$, said oscillator means having an output carrying said signal $f_o$ and a control input, said signal $f_o$ having a frequency responsive to the signal on said control input;

filter means (74, 76, 106, 208, 210) for coupling a filtered version of said output of said phase detector means to said control input of said oscillator means;

means (X1, X2, 70, 232) for coupling a PLL input clock signal $f_i$ to said first input of said phase detector means; and feedback means (82, 110, 216, 218) for coupling a feedback signal $f_f$ to said second input of said phase detector means;

a programmable logic circuit (10, 102, 202) having at least one logic circuit input (e.g., 26, 46, 128a, 256) and at least one logic circuit output (e.g. 26, 60, 130a, 236, 280); and inter-block coupling means (e.g., 60, 83, 128a, 220, 236, 256, 258, 304) for coupling said phase lock loop to said programmable logic circuit, wherein said inter-block coupling means comprises means (232) for coupling one of said logic circuit outputs to said first input of said phase detector means.

8. A single chip integrated circuit programmable logic device having fabricated thereon a phase lock loop (20, 200) comprising:

a phase detector (72, 206) having first and second inputs and having an output carrying an analog signal indicative of the phase difference between the signals on said first and second inputs of said phase detector;

a controllable oscillator (80, 212) having an analog control input and an output carrying a signal $f_o$ having a frequency responsive to said analog control input, said analog control input being coupled to receive a filtered version of said analog signal carried by said output of said phase detector; and a feedback path (82, 216, 281, 224) having an input end coupled to said output of said oscillator and having an output end coupled to said second input of said phase detector, said integrated circuit chip further having fabricated thereon a programmable state machine (10, 202) comprising:

a programmable combinatorial logic array (22, 28, 50, 52, 54, 250, 262, 266, 274, 276) having a plurality of array inputs and a plurality of array outputs being programmable such that each of said array outputs carries an array output signal which is a programmable Boolean function of a subset of said array inputs; and said data inputs being coupled to one of said array outputs and a subset of said data outputs being coupled to a corresponding subset of said array inputs, said integrated circuit chip further having fabricated thereon means (86, 216, 258, 250, 300, 218, 224, 304, 294) for coupling said signal $f_o$ to at least one of said clock inputs of said state registers.

9. An integrated circuit according to claim 8, wherein said means for coupling said signal $f_o$ to at least one of said clock inputs comprises a conductor connecting said output of said oscillator to said clock input.

10. An integrated circuit according to claim 8, wherein said feedback path comprises a p-stage binary counter (216), each stage having a signal input and a signal output, the signal input of the first stage being coupled to said output of said oscillator and the signal input of each of the other stages being coupled to the signal output of the previous stage, the signal output of the last stage being coupled to the second input of said phase detector, said signal outputs of each of said stages and said second input of said phase detector each being coupled to a respective array input (258).

11. An integrated circuit according to claim 8, for use with first (208) and second (210) package leads and an external circuit (214) having a signal input coupleable to said first package lead and a signal output coupleable to said second package lead, wherein said output of said phase detector is coupled to said first package lead and said control input of said controllable oscillator is coupled to said second package lead.

12. An integrated circuit according to claim 8, further having fabricated thereon an input multiplexer (232) having a first input (X1) coupleable externally, an output coupled to said first input of said phase detector and a second input (236) coupled to one of said array outputs.

13. An integrated circuit according to claim 8, wherein said output of said oscillator is further coupled to one of said array inputs.

14. An integrated circuit according to claim 13, wherein said second input of said phase detector is further coupled to one of said array inputs.

15. An integrated circuit according to claim 8, wherein said feedback path comprises a divide-by-n frequency divider (82) having a signal input coupled to said output of said oscillator, a signal output coupled to said second input of said phase detector, and a load n port coupled to a subset (60) of said array outputs.

16. An integrated circuit according to claim 15, wherein said frequency divider further has a load enable input coupled to one of said array outputs.

17. An integrated circuit according to claim 8, wherein said feedback path comprises:

a p-stage binary counter (216) having a signal input coupled to said output of said oscillator, each stage of said counter having an output; and a feedback multiplexer (218) having an output coupled to said second input of said phase detector, said feedback multiplexer further having a first input coupled to a first one of the elements in the group consisting of: said output of said oscillator; said output of each of said stages of said counter; and one of said array outputs (220), said feedback multiplexer further having a second input coupled to a second one of said elements in said group different from said first one of said elements.

18. An integrated circuit according to claim 17, wherein said feedback multiplexer has an input coupled to each of said elements in said group.

19. An integrated circuit according to claim 8, wherein said feedback path comprises a feedback multiplexer (218) having a first input coupled to said input end of said feedback path, an output coupled to said output end of said feedback path, and a second input (220) coupled to one of said array outputs.

20. An integrated circuit according to claim 19, wherein said feedback path further comprises a frequency divider (216) coupled between said input end of said feedback path and said first input of said feedback multiplexer.

21. An integrated circuit according to claim 8, wherein said means for coupling comprises a clock multiplexer (86, 294) having an output and at least a first and a second signal input, said first signal input being coupled to said output of said oscillator, said second signal input being coupled to one of said array outputs and said output of said clock multiplexer being coupled to said clock input of said at least one of said state registers, said multiplexer coupling to said output of said multiplexer selectably said first signal input or said second signal input.

22. An integrated circuit according to claim 21, wherein the selection performed by said clock multiplexer is fuse-programmable.

23. An integrated circuit according to claim 21, wherein said output of said oscillator is further coupled to one of said array inputs.

24. A single chip integrated circuit programmable logic device for use with an external capacitor (78), said chip having fabricated thereon a phase lock loop (20) comprising:

a phase detector (72) having first and second inputs and having an output carrying an analog signal indicative of the phase difference between the signals on said first and second inputs of said phase detector;

a damping filter (74) coupleable to said external capacitor and having an input coupled to said output of said phase detector and further having an output;

a VCO (80) having a voltage control input and an output carrying a signal $f_o$ having a frequency responsive to said voltage control input, said voltage control input being coupled to said output of said damping filter; and a divide-by-n frequency divider (82) having a signal input coupled to said output of said oscillator, a signal output coupled to said second input of said phase detector, a load n input port and a load enable input, said integrated circuit chip further having fabricated thereon a programmable state machine (10) comprising:

a programmable combinatorial logic array (22, 28, 50, 52, 54) having a plurality of array inputs and a plurality of array outputs; and a plurality of state registers (30), each of said state registers having a data input, a data output and a clock input, each of said data inputs being coupled to one of said array outputs and a subset of said data outputs being coupled to a corresponding subset of said array inputs, a subset (60) of said array outputs being coupled to said load n input port of said divide-by-n counter, one of said array outputs being coupled to said load enable input of said divide-by-n counter and one of said array inputs being coupled to said VCO output (83), said integrated circuit chip further having fabricated thereon a clock multiplexer (86) having an output and at least a first and a second signal input, said first signal input of said clock multiplexer being coupled to said output of said VCO, said second signal input of said clock multiplexer being coupled to one of said array outputs and said output of said clock multiplexer being coupled to said clock input of each of said said registers, said multiplexer coupled to said output of said multiplexer selectably said first signal input or said second signal input.

25. A single integrated circuit chip for use with a plurality of externally connectable pins and an external filter circuit (214) coupleable between first (208) and second (201) ones of said plurality of pins, said integrated circuit chip having fabricated thereon a phase lock loop (200) comprising:

a phase detector (206) having first and second inputs and having an output carrying an analog signal indicative of the phase difference between the signals on said first and second inputs of said phase detector, said output of said phase detector being coupled to said first pin;

a VCO (212) having a voltage control input and an output carrying a signal $f_o$ having a frequency responsive to said voltage control input, said voltage control input being coupled to said second pin;

a p-stage binary counter (216) having a signal input coupled to said output of said VCO, each stage of said counter having an output;

a feedback multiplexer (218) having a plurality of inputs, said plurality of inputs of said feedback multiplexer including one input coupled to the output of each of said stages in said binary counter, one input coupled to the output of said VCO, and one further input (220), said feedback multiplexer further having an output (224) coupled to said second input of said phase detector, said integrated circuit chip further having fabricated thereon a programmable state machine (202) comprising:

a programmable combinatorial logic array (250, 262, 266, 274, 276) having a plurality of array inputs and a plurality of array outputs; and a plurality of state registers (290), each of said state registers having a data input, a data output and a clock input, each of said data inputs being coupled to one of said array outputs and a subset of said data outputs being coupled to a corresponding subset of said array inputs, said plurality of array inputs including one array input (256) coupled to said first input of said phase detector and one array input (258) coupled to output of each of said stages of said p-stage binary counter, said plurality of array outputs including one array output (220) coupled to said further input of said feedback multiplexer, said integrated circuit chip further having fabricated thereon an input multiplexer (232) having a first input coupled to a third one (X1) of said plurality of pins, an output coupled to said first input of said phase detector and a second input (236) coupled to one of said array outputs, said integrated circuit chip further having fabricated thereon a clock multiplexer (294) having a first input (300) coupled to one of said array outputs, a second input (304) coupled to said output of said feedback multiplexer and a third input (302) coupled to a fourth one (254) of said plurality of pins and an output coupled to the clock input of at least one of said state registers.

* * * * *